US009543177B2

United States Patent
Miyajima et al.

(10) Patent No.: US 9,543,177 B2
(45) Date of Patent: Jan. 10, 2017

(54) POD AND PURGE SYSTEM USING THE SAME

(71) Applicant: TDK Corporation, Tokyo (JP)

(72) Inventors: Toshihiko Miyajima, Tokyo (JP); Tadamasa Iwamoto, Tokyo (JP); Jun Emoto, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 14/633,758

(22) Filed: Feb. 27, 2015

(65) Prior Publication Data

US 2015/0243538 A1    Aug. 27, 2015

(30) Foreign Application Priority Data

Feb. 27, 2014  (JP) .................................. 2014-036125

(51) Int. Cl.
  *B65D 85/00* (2006.01)
  *H01L 21/673* (2006.01)
  *H01L 21/677* (2006.01)

(52) U.S. Cl.
  CPC ... *H01L 21/67393* (2013.01); *H01L 21/67772* (2013.01)

(58) Field of Classification Search
  CPC .................... H01L 21/67369; H01L 21/67386
  USPC ................................. 206/711, 710, 449, 832
  See application file for complete search history.

(56) References Cited

U.S. PATENT DOCUMENTS

| 6,368,411 | B2 * | 4/2002 | Roberson, Jr. | H01L 21/67017 118/715 |
| 6,770,109 | B2 * | 8/2004 | Tanaka | H01L 21/67772 206/710 |
| 7,658,290 | B2 * | 2/2010 | Sumi | F16K 15/026 137/508 |
| 2004/0182472 | A1 * | 9/2004 | Aggarwal | H01L 21/67393 141/98 |
| 2011/0114534 | A1 * | 5/2011 | Watson | H01L 21/67393 206/710 |

FOREIGN PATENT DOCUMENTS

| JP | 11-307623 A | 11/1999 |
| JP | 2002-170876 A | 6/2002 |
| JP | 2010-270823 A | 12/2010 |

OTHER PUBLICATIONS

Japanese Office Action dated Oct. 14, 2016 issued in Japanese Patent Application No. 2014-036125 w/English translation.

* cited by examiner

*Primary Examiner* — Jacob K Ackun
*Assistant Examiner* — Jenine Pagan
(74) *Attorney, Agent, or Firm* — Oblon, McClelland, Maier & Neustadt, L.L.P.

(57) ABSTRACT

An object is to prevent the partial pressure of oxidative gas over time in an FOUP mounted on an FIMS system and left open. A surface purge unit is provided on a side opposite to the opening of the FOUP in such a way that wafers supported in the FOUP is located between the opening and the surface purge unit. The surface purge unit ejects inert gas from a plurality of vent holes provided in its surface toward the opening. Uniform purging or replacement of the interior of the FOUP with inert gas can be achieved by creating inert gas flow from an inert gas supply part extending over a surface in the direction from the interior of the FOUP toward the opening along the wafer surface.

7 Claims, 7 Drawing Sheets

POD AND PURGE SYSTEM USING THE SAME

BACKGROUND OF THE INVENTION

Field of the Invention

The present invention relates to a pod or an airtight container called FOUP (Front-Opening Unified Pod) in which wafers are housed, which is used in what is called an FIMS (Front-Opening Interface Mechanical Standard) system for transfer between semiconductor processing apparatuses. The present invention also relates to an FIMS system that also functions as a purge system that performs purging operation for cleaning the interior of the pod.

Description of the Related Art

The pod to which the present invention is directed includes a body part in which wafers are to be housed and a lid that closes the opening of the body part. The operations of opening and closing the lid of the pod and the transfer of wafers into/out of the pod are performed through a mini-environment in which a transfer robot with which a semiconductor processing apparatus is equipped is provided. A load port apparatus has a wall partly defining the mini-environment and having an opening portion leading to the mini-environment, a pod table on which a pod is placed with its opening directly facing the opening portion of the wall, and a door part that closes and opens the opening portion of the wall.

Typically, the interior of the pod loaded with wafers or the like is filled with dry nitrogen or the like gas that is controlled to be highly clean to prevent the entry of contaminants and oxidative gases etc. into the pod. However, while wafers in the pod are transferred to one of various kinds of processing apparatuses to undergo certain processing, the interior of the pod and the interior of the processing apparatus are kept in communication with each other. Consequently, the gas in the processing apparatus and the mini-environment enter the interior of the pod, and there is a possibility that oxygen and/or moisture in the gas may adhere to the surface of the wafers.

Oxidative gases such as oxygen form an ultrathin oxide film on the surface of the wafers or on the various kinds of layers formed on the wafers. There is a possibility that the presence of such an oxide film may prevent micro devices from having desired characteristics. A possible countermeasure to this is to introduce a gas with a controlled partial pressure of oxidative gas such as oxygen into the pod to prevent an increase in the oxygen partial pressure. A specific method is disclosed in Japanese Patent Application Laid-Open No. 11-307623. In the apparatus disclosed in this patent literature, a pod is provided with a tower-shaped gas supply nozzle projecting into the interior of the pod, and gas is supplied into the pod through a porous sintered material to fill the pod with inert gas.

In the apparatus disclosed in Japanese Patent Application Laid-Open No. 11-307623, the increase in the partial pressure of the oxidative gases is reduced by the supply of inert gas through the tower-shaped nozzle. It is generally the case that when wafers in the pod are to be actually subject to various processing, the lid is kept open until processing on all the wafers in the pod is completed. In this case, since down flow having high flow rate is created in the mini-environment in communication with the pod, in order to satisfactorily prevent diffusion of oxidative gases from the mini-environment into the pod, it is necessary to supply a large quantity of inert gas.

In conventional semiconductor devices, even if the flow rate of the supplied inert gas is so low as to lead to an increase in the partial pressure of oxidative gases such as oxygen, the degree of oxidation of wiring has been below a level to be addressed as a problem. However, with slimming of wiring in semiconductor devices in recent years, a further reduction in the oxygen partial pressure is required in order to prevent oxidation of thin wiring, even when the lid is kept open during consecutive wafer processing, during which no serious problem occurs with previous semiconductor devices. In view of the apparatus disclosed in Japanese Patent Application Laid-Open No. 11-307623, in order to ensure a flow rate in inert gas supply high enough to reduce the increase in the oxygen partial pressure, it is preferred that the use of a porous sintered material having a high conductance be eliminated. Supplied inert gas is introduced only one-dimensionally and only by diffusion, and therefore there may arise problems of uneven distribution of gas in purging and limited replacement efficiency.

SUMMARY OF THE INVENTION

The present invention has been made in view of the above-described circumstances, and its object is to provide a pod with which the partial pressure of oxidative gases such as oxygen in the pod can be kept at a predetermined low level even during consecutive processing of wafers and to provide a purge system using such a pod.

To achieve the above-described object, according to the present invention, there is provided a pod comprising shelves provided in the interior space, on which narrow plate-like contents, which are arranged along a height direction, are placed respectively, an opening through which said contents are transferred onto/from the shelves from/to outside, a lid that closes the opening to seal the interior space, and a surface purge unit having a surface provided as at least one of inner surfaces of the pod including a surface opposed to the opening and two side surfaces extending between the surface opposed to the opening and the opening, or a surface located between said inner surface of the pod and said contents, the surface purge unit ejecting a specific gas from a plurality of vent holes that the surface has toward the contents in a direction parallel to narrow surfaces of the contents arranged along the height direction.

In the above-described pod, it is preferred that the surface purge unit be provided as a surface opposite to the opening on the side opposite to the opening with the contents therebetween and adapted to eject the specific gas from the plurality of vent holes that the surface has toward the opening. It is also preferred that each of the vent holes is a slit having a narrow shape extending in the height direction as seen along the direction of emission of the gas, the length of the slit along the narrow direction being larger than at least two contents placed on the shelves. It is also preferred that the vent holes are arranged in an area corresponding to an area over which the contents are supported, when the interior of the pod is seen from the opening. It is also preferred that the pressure drop through one or some of the vent holes located at upper positions and the pressure drop through one or some of the vent holes located at lower positions are different from each other.

To achieve the above-described object, according to the present invention, there is provided a purge system comprising the above-described pod, a mount base on which the pod is placed, and a mount base gas supply port provided in the mount base and connected to an in-pod gas supply part, when said pod is placed on the mount base, to supply said specific gas to the in-pod gas supply part.

In the system according to the present invention, even when the lid is detached and interior of the pod and the mini-environment are in communication with each other, inert gas or the like of high purity is directly supplied into the interior of the pod without causing uneven distribution of the replacement gas. Therefore, it is possible to keep the partial pressure of oxidative gases such as oxygen in the pod at a predetermined low level even during the time in which wafers are processed consecutively.

Further features of the present invention will become apparent from the following description of exemplary embodiments with reference to the attached drawings.

DESCRIPTION OF THE EMBODIMENTS

In the following, an embodiment of the present invention will be described with reference to the drawings. The embodiment described in the following is not intended to limit the scope of the present invention as claimed, and all the combinations of the features described in the description of the embodiment are not necessarily essential to the present invention.

Figure 1:
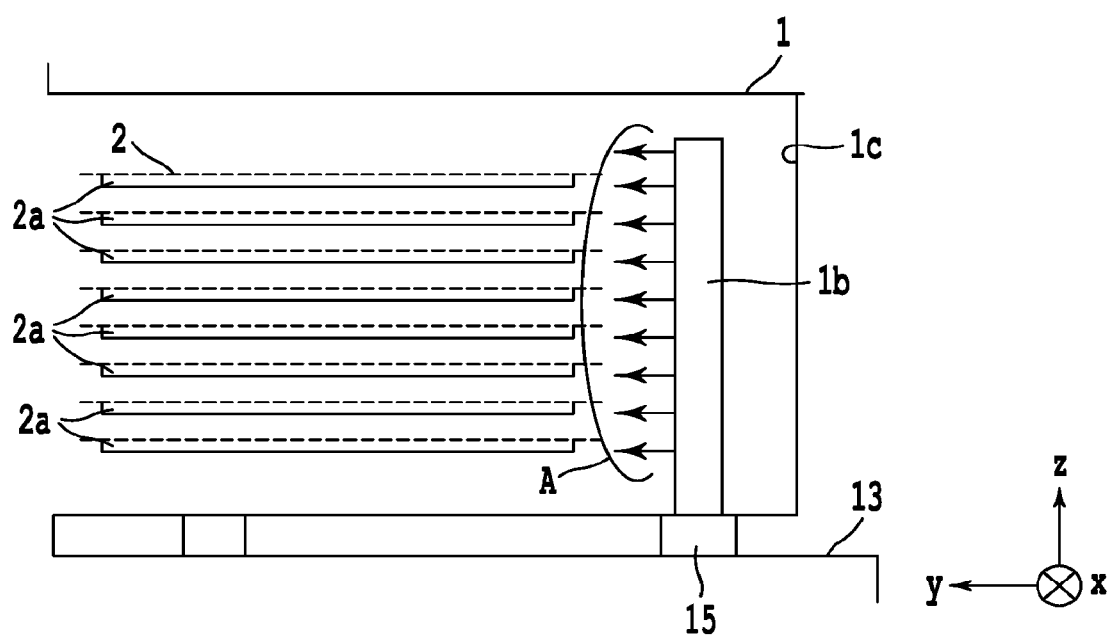
FIG. 1 is a schematic diagram illustrating a method of purging for a pod according to the present invention.

FIG. 1 is a diagram schematically showing the structure of a pod according to an embodiment of the present invention. Specifically, FIG. 1 shows a cross section of a mount base, which will be described later, a pod, and the opening of the pod. In FIG. 1 arrows schematically show how inert gas is supplied to them. The purge operation described in the following refers to a process of introducing an inert gas such as nitrogen or a specific gas into the pod to purge the gas existing inside the pod. In FIG. 1, wafers 2 as contents are housed in the inner space of the pod 1. The wafers 2 are arranged in parallel to each other along the vertical direction on shelves 2a arranged in a range of a predetermined holding region, and each wafer 2 extends in the horizontal direction. The horizontal and vertical directions mentioned above respectively refer to the direction in which the bottom of the pod 1 extends and the direction in which the open face of the pod 1 extends, which may different from the actual horizontal direction and the vertical direction.

FIG. 1 shows the mount base 13 of a load port apparatus 100 (see FIG. 4) on which the pod is placed. The load port apparatus 100 is a part of the purge system according to the present invention. In FIG. 1, the lid (not shown) of the pod 1 has already been detached, and an opening portion (not shown) of the load port and the interior of the pod 1 are in communication with each other. The mount base 13 is provided with mount base gas supply ports 15, which cooperate with in-pod gas supply towers 1b provided on the opposed surface of the pod 1 to enable supply of a specific inert gas into the interior of the pod 1 through a surface purge unit 4 (see FIGS. 2A to 2D). The in-pod gas supply towers 1b are located near the two corners on the side 1c of the pod 1 opposite to the opening so that they do not interfere with the wafers 2 housed in the pod 1. The surface purge unit 4 is arranged between the in-pod gas supply towers 1b and connected to them.

The surface purge unit 4 has a plurality of vent hole formed on its surface through which inert gas is ejected, so that the inert gas can be blown out from this surface into the interior of the pod in a direction substantially perpendicular thereto. The area over which the vent holes are provided extends over the entirety of the holding region of the wafers 2 in the pod. Consequently, the atmosphere in the entire space in which the wafers 2 are contained can be replaced at the same time. The in-pod gas supply towers 1b and the surface purge unit 4 extend upwardly from the bottom of the pod 1 and supply inert gas into the interior of the pod 1 directionally so that a gas flow A directed toward the opening 1a of the pod is created. Specifically, the in-pod gas supply unit composed of the in-pod gas supply towers 1b and the surface purge unit 4 blows inert gas in such a way as to create laminar flows parallel to the wafers 2 flowing from the side of the pod 1 opposite to the opening toward the opening 1a.

Figure 2A:
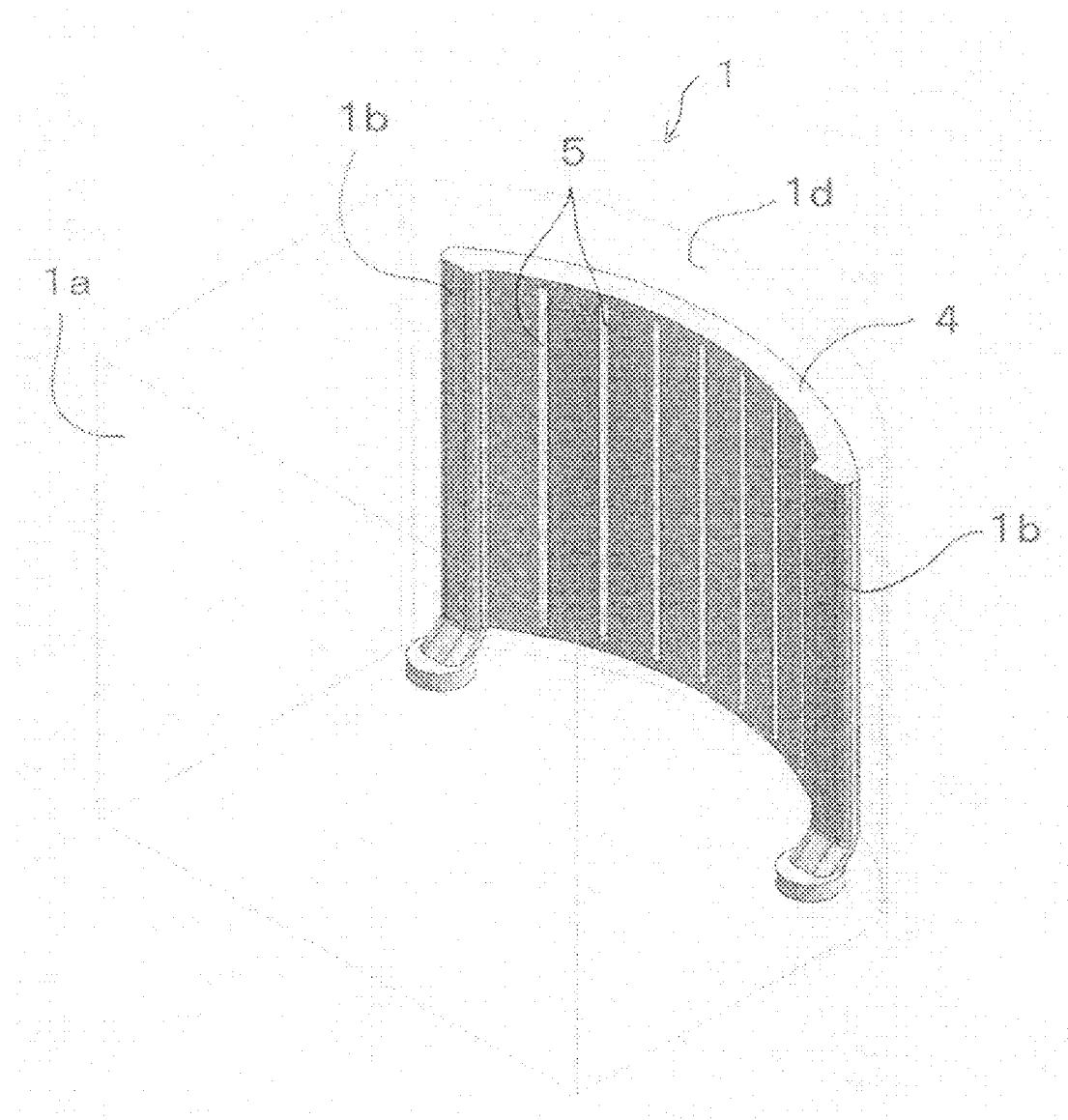
FIG. 2A is a perspective view of a surface-type nozzle used in a pod according to an embodiment of the present invention.

Now, details of the in-pod gas supply unit composed of the in-pod gas supply towers 1b and the surface purge unit 4 will be described with reference to FIGS. 2A to 2D. FIGS. 2A to 2D are perspective views schematically showing the positional relationship of the in-pod gas supply unit and the pod. In FIGS. 2A to 2D, the components in the pod other than the in-pod gas supply unit are not shown. FIG. 2A shows a mode of the surface purge unit 4 in which the in-pod gas supply unit 4 is provided with a plurality of narrow long slits 5 extending in the vertical direction. Each in-pod gas supply tower 1b has a hollow part having a room into which inert gas supplied through the mount base gas supply port 15 flows. The surface purge unit 4 has a slim box-like shape having an internal room in communication with this hollow part. The surface purge unit 4 extends along and in contact with the wall 1d of the pod 1 opposite to the opening. The surface purge unit 4 curves in shape along its length and virtually constitutes a wall opposite to the opening.

The surface of the surface purge unit 4 that faces the opening 1a of the pod 1 is provided with narrow slits 5 substantially parallel to the in-pod gas supply tower 1b through which gas is blow out. In this mode, each of the slits 5 has a narrow shape and extends continuously from a location near closer to the bottom of the pod 1 than the lowermost wafer 2 in the pod to a location closer to the ceiling of the pod than the uppermost wafer 2 in the pod. With this arrangement, inert gas is supplied from the slits 5 to create laminar flows parallel to the planes of the wafers 2. As inert gas is supplied from substantially the entirety of the side 1d of the pod opposite to the opening toward the opening 1a, a large amount of highly pure inert gas can supplied directly into the pod without causing uneven distribution of the replacement gas. The above-described arrangement can make the overall flow channel for introducing the inert gas into the pod 1 large, enabling supply of inert gas larger in quantity than in the case where the gas is supplied through simple tower shaped nozzles while keeping the flow speed low.

As a modification, each slit 5 extending in the vertical direction may be replaced by a plurality of slits 5 arranged along the same axis with predetermined spacing. In the case of this mode also, it is preferred that the lower end of the lowermost slit 5 and the upper end of the uppermost slit 5 be located at the same positions as the upper and lower ends of the slit 5 shown in FIG. 2A. In the case of the mode in which a plurality of narrow slits are arranged along the vertical direction, it is necessary that the length of a single slit 5 be designed in such a way that at least two wafers 2 housed in the pod 1 are included in its length range. Moreover, it is necessary that a gap between the lower end of the upper slit 5 among two slits 5 adjacent along the vertical direction and the upper end of the lower slit 5 among the two slits be located at positions corresponding to the same gap between wafers 2. With the above-described arrangement, inert gas can be supplied as laminar flows parallel to the planes of the wafers 2.

If, for example, inert gas is supplied from a circular port, the gas will diffuse or diverge in directions perpendicular to the direction in which the gas is ejected as the gas flows away from the nozzle, even if the length of the port is made long in order to enhance the directionality of the supplied gas. Especially, in the case of the pod 1, of which the volume is limited, it is difficult to design the nozzle port to have a length long enough to provide high directionality. Therefore, there would arise circumstances in which the diffusing inert gas impinges on the front and/or back surface of the wafers 2. The back surface of the wafers 2 are in contact with various parts in various occasions, e.g. when supported by a transfer robot for transfer of the wafers 2. Therefore, the back surface might be contaminated with fine dust or the like adhering thereto. The dust or the like adhering to the back surface might be blown off in the pod by the diffusing inert gas. Supplying the inert gas in laminar flows parallel to the front and back surfaces of the wafers can greatly reduce the possibility of the blowing-off of dust.

The above-described condition in the case where a plurality of slits are provided is a condition for creating preferable laminar flows in all the spaces between the wafers 2. Alternatively, each slit 5 may be provided for each wafer 2. In this case, it is preferred that each slit has a length larger than the thickness of the corresponding wafer 2 and that the upper end and the lower end of the slit are located outside above and below the upper surface and the rear surface of the corresponding wafer 2 respectively. In other words, the slit 5 has a narrow shape extending in the vertical direction when seen in the direction of ejection of inert gas. It is preferred that each slit 5 have a length in the narrow direction larger than at least two wafers placed on a rack in the pod 1, that the slit 5 be arranged to be opposed to the wafers 2 placed on the rack and the length of the slit 5 thus arranged be so long that the upper end of the slit 5 is higher than the front surface of the wafer 2 and the lower end of the slit is lower than the rear surface of the wafer 2, or that the length of the slit 5 be so long that the upper end of the slit 5 is higher than the front surface of the wafer 2 placed on the uppermost shelf of the rack and the lower end of the slit is lower than the rear surface of the wafer 2 placed on the lowermost shelf of the rack.

In order to create laminar flows, the mode shown in FIG. 2A using slits 5 not separated along the vertical direction is the most preferable. However, due to the limited internal volume of the pod 1, the allowable thickness of the surface purge unit 4 is small, and the thickness of the plate having the slits 5 is necessarily small. Therefore, from the standpoint of ease and accuracy of machining, the mode shown in FIG. 2B using slits 5 separated along the vertical direction is more preferable. In the case where inert gas is supplied from a surface, as is the case with the present invention, even if the flow speed of the inert gas passing through the slits 5 is low, the overall flow rate of the supplied inert gas can be sufficiently large, as has already been described. Therefore, it is possible to supply a sufficient amount of inert gas without generating dust or the like by using the surface purge unit 4, even if laminar flows like those created by the arrangement shown in FIG. 2A are not formed. Therefore, alternative modes aiming at improvement in machinability or improvement in the evenness in inert gas supply may be developed. In the following alternative modes will be described.

Figure 2B:
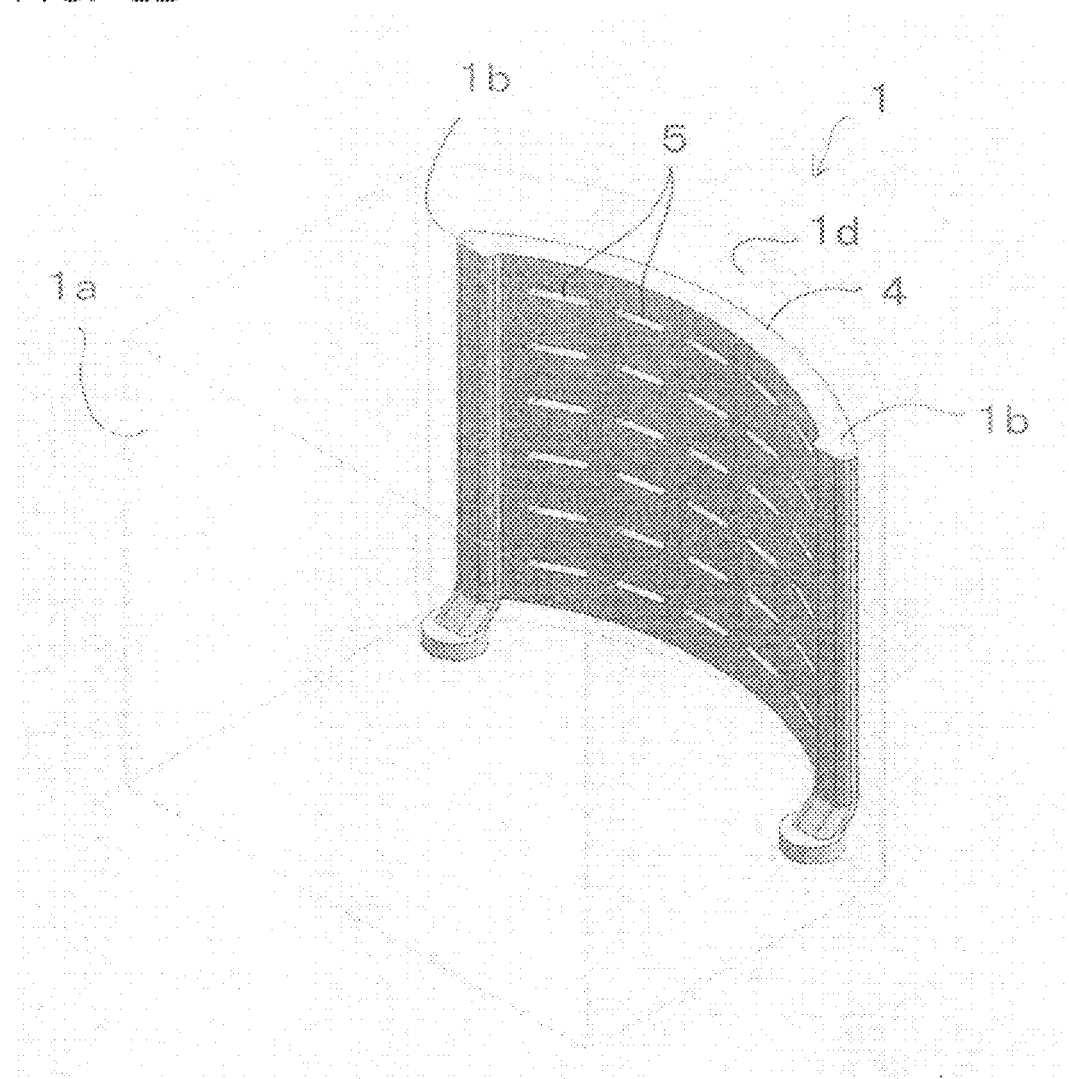
FIG. 2B is a perspective view of another mode of the surface-type nozzle according to the present invention.

FIG. 2B shows a mode in which slits 5 extending along the length direction of the surface purge unit 4 extending from one of two in-pod gas supply towers 1b to the other. Inert gas supplied from the mount base gas supply ports 15 to the lower end of the in-pod gas supply towers 1b reaches the upper ends of the towers 1b and changes its direction toward the surface purge unit 4. Consequently, the flow rate of the inert gas is highest in the vicinity of the upper end at which the direction of flow changes and lowest in the vicinity of the lower end farthest from the upper end. Therefore, it is preferred that the pressure drop through the slits 5 be varied by varying the width of the slits 5 to uniformize the supply of inert gas from the surface purge unit 4 into the pod 1. Specifically, the pressure drop can be varied by decreasing the width of the slits 5 from lower slits to upper slits. In the case of the vertical slits shown in FIG. 2A, it is difficult to adjust the variation finely or extremely largely. However, in the mode shown in FIG. 2B, the variation can be adjusted easily.

Figure 2C:
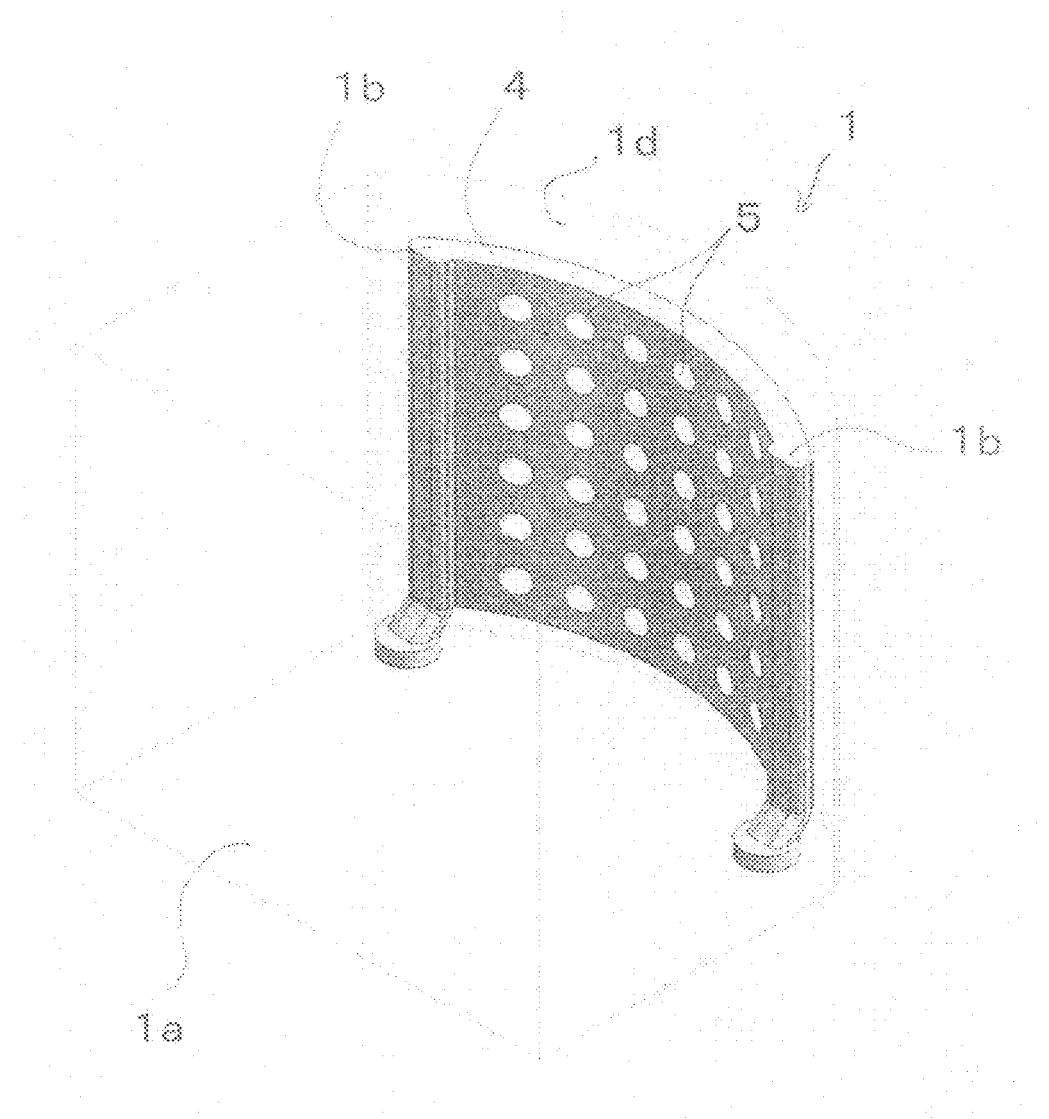
FIG. 2C is a perspective view of still another mode of the surface-type nozzle according to the present invention.
Figure 2D:
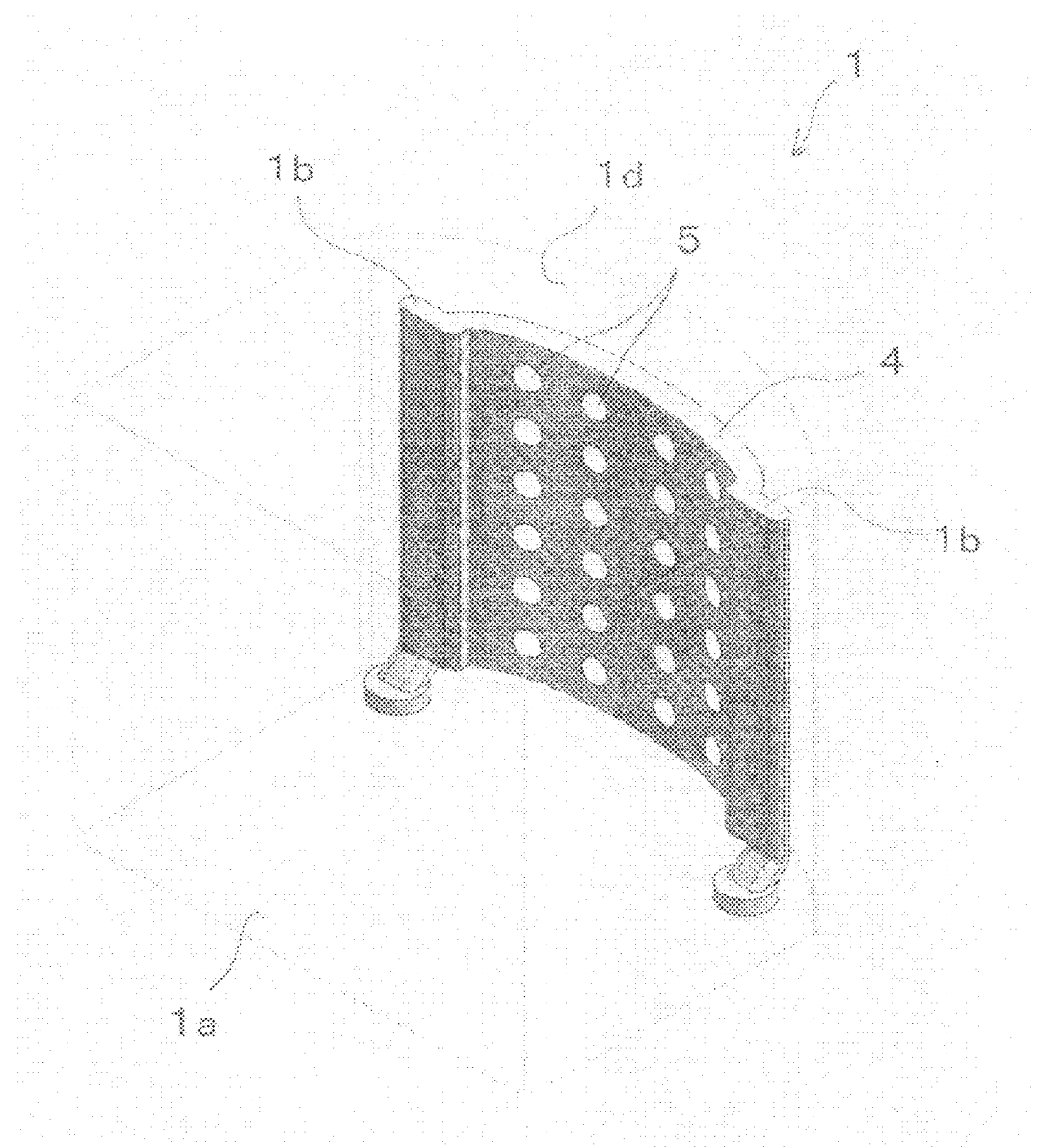
FIG. 2D is a perspective view of still another mode of the surface-type nozzle according to the present invention.

FIG. 2C shows a mode in which vent holes 5 having a simple circular shape are provided. This mode is advantageous in that the vent holes 5 can be formed easily and that the required strength of the plate provided with the vent holes 5 is lowest. The circular vent holes are inferior to slit-like vent holes in creating laminar flows preventing blowing-off of dust. However, the flow rate of inert gas supplied through each hole can be reduced by increasing the number of holes, and thereby turbulent flow can be reduced. Moreover, the aforementioned variation or difference in the pressure drop between the upper holes and the lower holes can easily be provided by varying the number of holes and/or the diameter of the holes. FIG. 2D shows a mode basically the same as the mode shown in FIG. 2C but different in the design of the in-pod gas supply towers 1b. Specifically, a room having the function of pressure adjustment or a communication hole with varying pressure drop is provided in the channel between the hollow part of each in-pod gas supply tower 1b and the internal room of the surface purge unit 4, thereby reducing the difference between the inert gas supply from the upper part of the surface purge unit 4 and the inert gas supply from the lower part of the surface purge unit 4.

The above-described modes of the surface purge unit 4 are preferable illustrative modes, to which various modifications can be made. For example, in the mode shown in FIG. 2A, slits having a different length may be additionally provided between the slits 5. A porous sintered material like that disclosed Japanese Patent Application Laid-Open No. 11-307623 may be used in the surface purge unit 4, if a sufficient flow rate of inert gas can be achieved and the surface purge unit 4 can be designed to have an appropriate shape.

Figure 3:
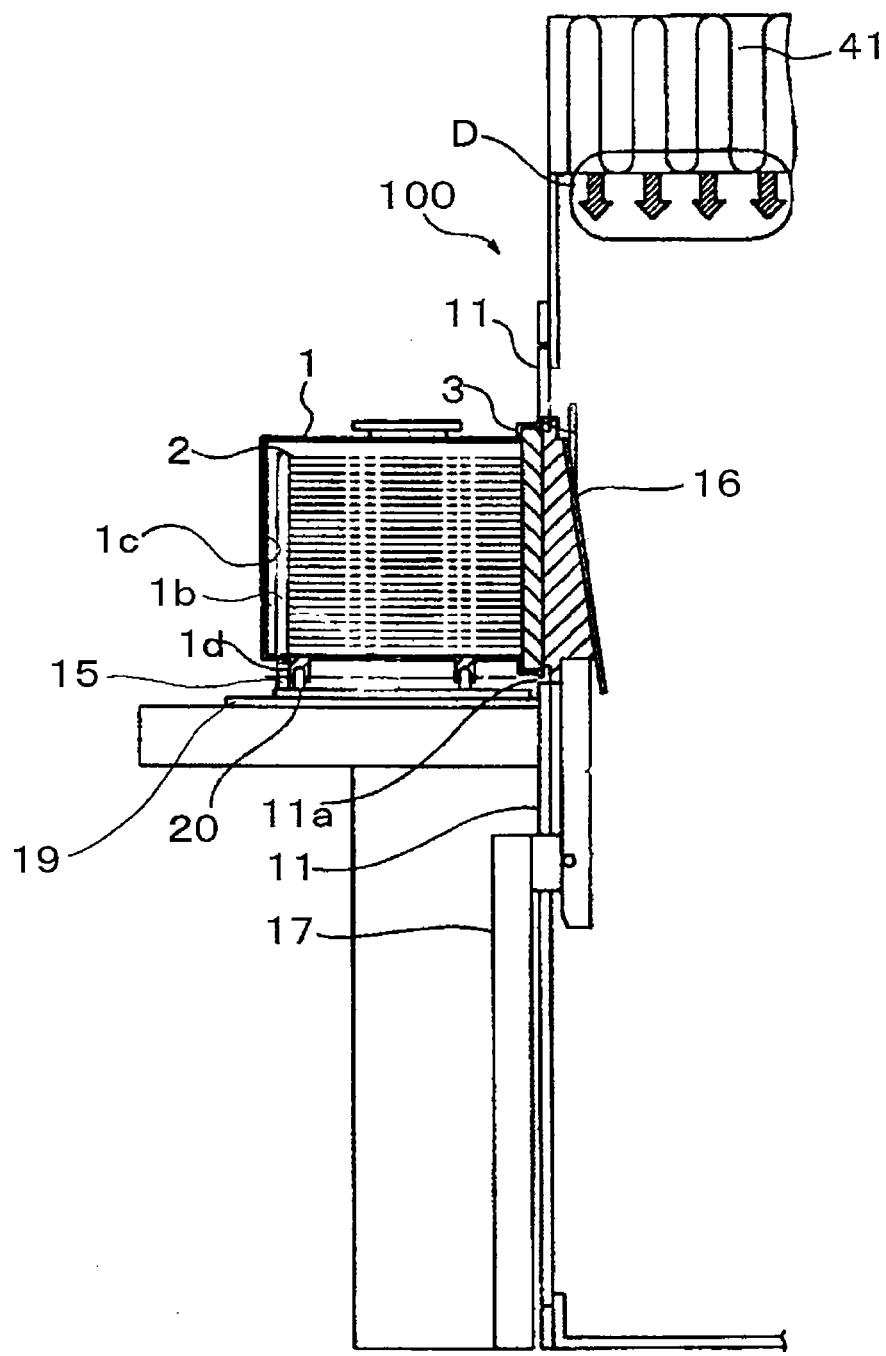
FIG. 3 is a cross sectional view showing the pod according to the embodiment of the present invention shown in FIG. 1, a purge system on which the pod is placed, the lid of the pod, and a portion of an opener, taken on a plane perpendicular to the pod opening.

In the following, a specific embodiment of the present invention will be described with reference to the drawings. FIG. 3 is a diagram showing the relevant portion of the load port apparatus (a component of the purge system of the present invention) according to an embodiment of the present invention. FIG. 3 shows relevant components of the load port apparatus 100 such as a mount base 13, a door 16, a portion of a door opening/closing mechanism 17, and a wall 11 with an opening portion 11a, which partly defines a mini-environment. FIG. 3 shows a cross section of the load port 100 and a pod 1 placed on the load port 100 (specifically, the mount base 13) with the lid 3 of the pod 1 being in contact with the door 16. The pod 1 has a plurality of shelves 2a onto/from which wafers are placed/taken away from outside, the lid 3 that tightly closes the opening 1a, and the aforementioned in-pod gas supply towers 1b (in-pod gas supply parts). The shelves 2a are arranged along direction of arrangement of wafers 2.

The mount base 13 is provided with the aforementioned gas supply ports 15, a movable plate 19, and positioning pins 20. The pod 1 is placed actually on the movable plate 19. The movable plate 19 has a narrow top surface on which the pod 1 is placed and can move the pod 1 placed thereon toward and away from the opening portion 11a. The positioning pins 20 are planted on the narrow surface of the movable plate 19. The positioning pins 20 engage positioning recesses 1d provided on the bottom of the pod 1 to determine the positional relationship of the pod 1 and the movable plate 19 uniquely. Moreover, as described above, as the pod 1 is placed, the mount base gas supply ports 15 and the in-pod gas supply towers 1b come in communication with each other to establish a state that allows inert gas to be supplied into the pod 1 through them.

Figure 4:
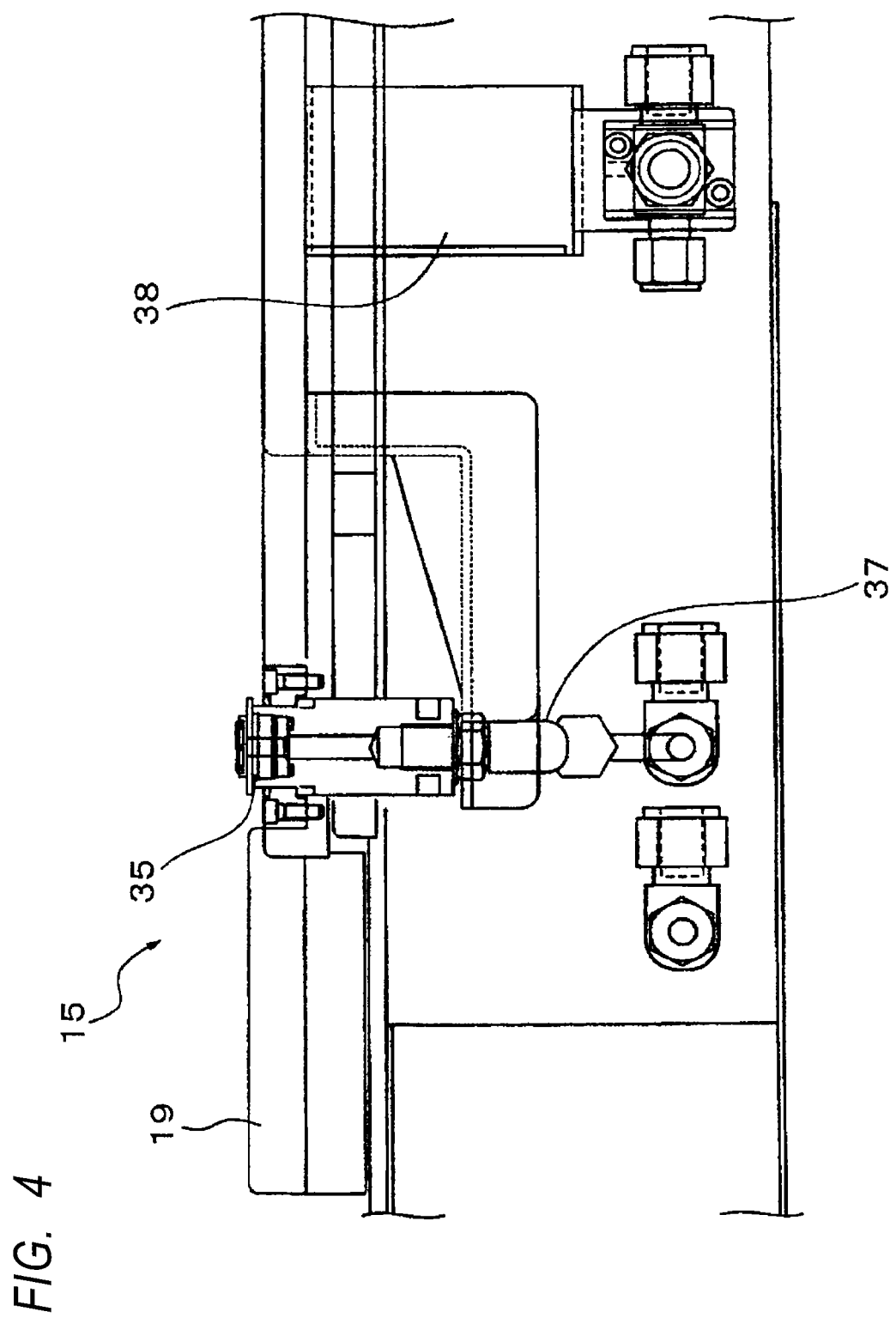
FIG. 4 is a cross sectional view of a mount base of the purge system shown in FIG. 3, taken on a vertical plane containing a gas supply valve.

Now, the mount base gas supply ports 15 will be described with reference to FIG. 4, which is a vertical cross sectional view of the mount base 13 taken on a plane containing the ports 15. The mount base gas supply port 15 has a gas supply valve 35, which is a check valve that can supply gas only one-directionally. Inert gas is supplied to the gas supply valve 35 by an inert gas supply system not shown in the drawing through a gas supply pipe 37. The inert gas supply system can supply inert gas at a controlled pressure and controlled flow rate and can stop the supply of inert gas. The gas supply valve 35 is mounted on the mount base 13 by a valve up/down mechanism 38. The valve up/down mechanism 38 can shift the gas supply valve 35 between a supply position at which the gas supply valve 35 can supply inert gas to the pod 1 and a standby position at which the gas supply valve 35 does not supply inert gas and does not interfere with the bottom of the pod 1.

The opening portion 11a provided on the wall 11 is rectangular in shape and has a size that allows the lid 3 that closes the opening 1a of the pod 1 to fit into it when the pod 1 comes closest to the opening portion 11a. In other words, the size of the rectangular opening portion 11a is a little larger than the rectangular outer shape of the lid 3. The movable plate 19 sets the pod 1 stationary at a position that allows the door 16 to detach the lid 3 of the pod 1 from the pod body. The door 16 is supported by the door opening/closing mechanism 17 via a door arm. The door opening/closing mechanism 17 can move the door 16 between a position at which the door 16 substantially closes the opening portion 11a and a retracted position at which the door 16 leaves the opening portion 11a open fully to allow a transfer mechanism (not shown) to transfer wafers 2 into/out of the pod 1 through the opening portion 11a.

In the above-described embodiment, the in-pod gas supply towers 1b are arranged to extend into the interior of the pod 1 from the bottom of the pod 1 in the set state. Alternatively, the in-pod gas supply towers 1b may be arranged to extend from the ceiling or the bottom, which are parallel to the planes of the wafers in the pod. The surface purge unit 4 may be connected with the in-pod gas supply towers 1b and arranged on the side opposite to the opening 1a so that the wafers 2 are located between the opening 1a and the surface purge unit 4. Alternatively, the surface purge unit 4 may be directly connected with the mount base gas supply ports 15 without the towers by connecting means provided at the bottom of the surface purge unit 4, if inert gas can be supplied uniformly over the surface.

The gas discharged out of the pod 1 is brought to the lower part of the mini-environment and then to the external space by down flow D created by a fan filter unit 41 provided above the mini-environment. Thus, the gas flow A created by supplying inert gas through the in-pod gas supply unit and the down flow D created at the same time improve the efficiency of purging of the interior of the pod 1 in which already processed wafers are housed.

In the apparatus according to the present invention, even when the lid 3 of the pod 1 is open and external gas can enter into the pod 1, a large quantity of gas can be continuously supplied to the entirety of the interior of the pod 1 through the in-pod gas supply unit. Therefore, entry of atmospheric gas into the pod 1 from the outside can be prevented favorably, and it is possible to prevent a rise in the partial pressure of oxidative gases without inviting uneven distribution of replacement gas. In conventional apparatuses, even in cases where the processing time of one wafer is not so long, it is necessary to close the lid 3 appropriately in order to reduce the oxygen partial pressure while waiting for the completion of processing. In case of the apparatus according to the present invention, the partial pressure of oxidative gases can be kept lower than a predetermined value all the time, even in cases where the waiting time is long. In consequence, the quality of all the wafers in the pod can be kept uniformly. Moreover, it is possible to process wafers consecutively while leaving the lid 3 open. In consequence, the processing time and the load on the apparatus can be reduced advantageously.

In the case of the above-described embodiment, the mount base 13 is provided with only mount base gas supply ports 15. However, if the sealing performance of the lid 3 is not satisfactory due to time-based deterioration, excessive supply of inert gas to the pod 1 needs to be addressed in some cases. Specifically, the apparatus may be adapted to discharge gas from the pod 1 when the internal pressure of the pod 1 becomes high with supply of gas to create a flow of clean gas in the pod 1, thereby effectively reducing the partial pressure of oxidative gases. To this end, it is preferred that the mount base 13 be provided with gas discharge ports in addition to the mount base gas supply ports 15 provided on its top face. The valve used in each gas discharge port has a same structure as that shown in FIG. 5. The pod 1 is also provided, on its bottom, with ports cooperating with these valves.

In the above-described embodiment, the surface purge unit 4 is arranged on the side 1c opposite to the opening. The pod 1 has two opposed side walls extending between the side having the opening 1a and the side 1c opposite to the opening. The two opposed side walls are provided with shelves on which the wafers 2 are supported horizontally.

The most convenient location at which the surface purge unit is to be provided is on the side 1c opposite to the opening, because the wall on this side does not have shelves. Nevertheless, the surface purge unit 4 may be provided as at least one the surfaces including the surface on the side opposite to the opening and the surfaces of the aforementioned two opposed sides. In other words, the surface purge unit(s) may be provided on one of the two opposed sides, both of the two opposed sides, one of the two opposed sides and the side opposite to the opening, or both of the two opposed sides and the side opposite to the opening. In all the cases, each surface purge unit may be adapted to eject inert gas from a plurality of vent holes arranged on the inside surface of the surface purge unit toward the wafers 2 in the direction parallel to the planes of the wafers 2 arranged along the vertical direction. It is not necessary that the surface purge unit 4 be narrow, but it may be curved at a curvature the same as the outer contour of the wafer 2. The above-described features may be modified appropriately taking into consideration various factors such as the number of wafers 2 housed in the pod, the internal volume of the pod 1, the required partial pressure of oxidative gases, the partial pressure and flow rate of oxidative gases entering the pod 1 from outside, and ease of manufacturing.

Thus, the surface serving as the surface purge unit 4 having two-dimensionally arranged vent holes for supplying inert gas into the pod may be provided as at least one of the inner surfaces of the pod 1 on the side opposite to the opening and on the two opposite sides extending between the opening and the side opposite to the opening or as a surface located between the inner surface of the pod and the wafers. In other words, the vent holes may be provided directly on an inner surface(s) of the pod or on a surface between an inner surface of the pod and the wafers, as is the case with the above-described embodiment.

While the apparatus of this embodiment is directed to the FOUP and the FIMS, the pod and the system to which the present invention is applied are not limited to them. The lid opening/closing system according to the present invention can be applied to any front open type container in which a plurality of objects are housed and any system that opens/closes the lid of the container and transfers the objects housed in the container into/out of it and can keep the partial pressure of oxidative gases in the interior of the container low. In cases where a specific gas having desired characteristics is used to fill the container instead of inert gas, the lid opening/closing system according to the present invention can be used to maintain the partial pressure of this specific gas inside the container high.

As described above, the present invention relates to a pod and a purge apparatus suitable for use with semiconductor processing apparatuses. However, the applicability of the present invention is not limited to use with such processing apparatuses, but the present invention can also be applied to a pod or the like used with various processing apparatuses that perform processing similar to semiconductor processing, such as processing apparatuses for liquid crystal display panel.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-036125, filed Feb. 27, 2014 which is hereby incorporated by reference herein in its entirety.

What is claimed is:

1. A pod comprising:
   shelves provided in an interior space of the pod, on which shelves narrow plate-like contents spaced along a height direction may be placed respectively;
   an opening of the pod through which the contents may be transferred onto/from said shelves from/to outside;
   a lid configured to close said opening to seal said interior space;
   a surface purge unit having a surface provided as at least one of the inner surfaces of the pod, the one of the inner surfaces including a surface opposed to said opening and two side surfaces extending between said surface opposed to said opening and said opening, the surface purge unit having a plurality of vent holes and being arranged to eject a specific gas toward said contents in a direction parallel to surfaces of said contents; and
   at least two gas supply towers which connect to the surface of the surface purge unit provided as at least one of the inner surfaces of the pod, wherein the specific gas is supplied to the surface of the purge unit through the at least two gas supply towers.

2. A pod according to claim 1, wherein said surface purge unit is provided as a surface opposite to said opening with said contents therebetween and is configured to eject the specific gas from the plurality of vent holes toward said opening.

3. A pod according to claim 1, wherein each of said vent holes is a slit extending in said height direction, the length of the slit being larger than a spacing of at least two of said shelves.

4. A pod according to claim 1, wherein said vent holes are arranged in an area corresponding to the entirety of an area over which said contents are to be supported on the shelves, when the interior of the pod is seen from said opening.

5. A pod according to claim 1, wherein a pressure drop through one or some of said vent holes located at upper positions in said pod and the pressure drop through one or some of said vent holes located at lower positions in said pod are different from each other.

6. A purge system comprising:
   a pod comprising shelves provided in an interior space thereof, on which shelves narrow plate-like contents spaced along a height direction may be placed respectively; an opening of the pod through which the contents may be transferred onto/from said shelves from/to outside; a lid configured to close said opening to seal said interior space; and a surface purge unit having a surface provided as at least one of the inner surfaces of the pod, the one of the inner surfaces including a surface opposed to said opening and two side surfaces extending between said surface opposed to said opening and said opening, the surface purge unit having a plurality of vent holes and being arranged to eject a specific gas toward said contents in a direction parallel to surfaces of said contents;
   a mount base on which said pod is placed;
   a mount base gas supply port provided in said mount base and connected to said surface purge unit, when said pod is placed on said mount base, to supply said specific gas to said surface purge unit; and
   at least two gas supply towers which connect to the surface of the surface purge unit provided as at least one of the inner surfaces of the pod, wherein the specific gas is supplied to the surface of the purge unit through the at least two gas supply towers.

7. A pod according to claim 1, wherein the surface of the surface purge unit provided as at least one of the inner surfaces of the pod is arranged between the gas supply towers and is connected to the gas supply towers.

* * * * *